United States Patent
Yang et al.

(10) Patent No.: US 12,119,841 B2
(45) Date of Patent: Oct. 15, 2024

(54) G-LDPC DECODER AND G-LDPC DECODING METHOD

(71) Applicant: Samsung Electronics Co., Ltd., Suwon-si (KR)

(72) Inventors: Dae-Yeol Yang, Suwon-si (KR); Bohwan Jun, Suwon-si (KR); Hong Rak Son, Suwon-si (KR); Geunyeong Yu, Suwon-si (KR); Youngjun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/141,103

(22) Filed: Apr. 28, 2023

(65) Prior Publication Data
US 2024/0106462 A1    Mar. 28, 2024

(30) Foreign Application Priority Data
Sep. 27, 2022   (KR) .................. 10-2022-0122359

(51) Int. Cl.
*H03M 13/11* (2006.01)
*H03M 13/00* (2006.01)

(52) U.S. Cl.
CPC ...... *H03M 13/1111* (2013.01); *H03M 13/611* (2013.01)

(58) Field of Classification Search
CPC ............ H03M 13/1111; H03M 13/611; H03M 13/1174; H03M 13/453; G11C 2029/3602; G11C 29/10; G11C 29/36; G11C 29/42; G06F 11/00
See application file for complete search history.

(56) References Cited

U.S. PATENT DOCUMENTS

| | | | |
|---|---|---|---|
| 7,752,523 | B1 | 7/2010 | Chaichanavong et al. |
| 10,084,481 | B2 | 9/2018 | Sommer et al. |

(Continued)

OTHER PUBLICATIONS

M. Lentmaier et al., "On Generalized Low-Density Parity-Check Codes Based on Hamming Component Codes", IEEE Communications Letters, vol. 3, Issue No. 8, Aug. 1999, pp. 248-250.

(Continued)

*Primary Examiner* — Thien Nguyen
(74) *Attorney, Agent, or Firm* — Sughrue Mion, PLLC

(57) ABSTRACT a G-LDPC decoder is provided. The G-LDPC decoder includes: a generalized check node decoder configured to, in each of a plurality of iterations: group connected variable nodes into groups, the connected variable nodes being connected to an $m^{th}$ generalized check node among generalized check nodes; generate test patterns in each of one or more of the groups based on a first message received by the $m^{th}$ generalized check node from the connected variable nodes; and identify a value of a second message to be provided from the $m^{th}$ generalized check node to the connected variable nodes based on the test patterns; and a LDPC decoder circuitry configured to, in each of the iterations, update a value of an $n^{th}$ variable node, among the variable nodes, based on the second message received by the nth variable node from a generalized check node that is connected to the nth variable node.

20 Claims, 14 Drawing Sheets

(56) References Cited

U.S. PATENT DOCUMENTS

| | | |
|---|---|---|
| 10,205,469 B2 | 2/2019 | Kumar et al. |
| 10,715,178 B2 | 7/2020 | Sharon et al. |
| 10,915,396 B1 | 2/2021 | Lu et al. |
| 11,184,024 B2 | 11/2021 | Xiong et al. |
| 2009/0013239 A1 | 1/2009 | Blanksby |
| 2012/0266042 A1* | 10/2012 | Shen ................ H03M 13/6356 |
| | | 714/755 |

OTHER PUBLICATIONS

Wang Ping et al, "Generalized LDPC Codes for Deep Space Communication Systems", IEEE 11th International Conference on Signal Processing (ICSP 2012), Oct. 2012, pp. 1279-1282.

Yige Wang et al., "Doubly Generalized LDPC Codes", IEEE International Symposium on Information Theory (ISIT), Jul. 2006, pp. 669-673.

David Chase, "A Class of Algorithms for Decoding Block Codes With Channel Measurement Information", IEEE Transactions on Information Theory, vol. IT-18, Issue No. 1, Jan. 1972, pp. 170-182.

Junhee Cho et al., "Reduced Complexity Chase-Pyndiah Decoding Algorithm for Turbo Product Codes", IEEE Workshop on Signal Processing Systems (SiPS), Oct. 2011, pp. 210-215.

Sherif Elsanadily et al., "Improving the Decoding Performance of High-Rate GLDPC Codes in Low Error-Rate Applications", 13th International Conference on Computer Engineering and Systems, Dec. 2018, pp. 375-378.

* cited by examiner

FIG. 4

$$H = \begin{bmatrix} 1 & 1 & 0 & 1 & 0 & 0 & 0 & 1 & 1 & 0 & 1 & 0 & 0 & 1 \\ 1 & 0 & 1 & 0 & 0 & 1 & 0 & 1 & 0 & 1 & 0 & 1 & 1 & 0 \\ 0 & 1 & 0 & 1 & 1 & 0 & 1 & 0 & 1 & 0 & 0 & 1 & 1 & 0 \\ 0 & 0 & 1 & 0 & 1 & 1 & 1 & 0 & 0 & 1 & 1 & 0 & 0 & 1 \end{bmatrix}$$

FIG. 5

G-LDPC DECODER AND G-LDPC DECODING METHOD

CROSS-REFERENCE TO RELATED APPLICATION

This application claims priority to Korean Patent Application No. 10-2022-0122359, filed in the Korean Intellectual Property Office, on Sep. 27, 2022, the disclosure of which is incorporated by reference herein in its entirety.

BACKGROUND

1. Field

The disclosure relates to a generalized low-density parity-check (G-LDPC) decoder and a G-LDPC decoding method.

2. Description of Related Art

As semiconductor manufacturing technology advances, integration and capacity of memory devices have increased. However, with the high integration of the memory devices, a variety of new problems have been identified. For example, an error rate of data stored in a memory device may increase due to high integration. On the other hand, as communication technology advances, high-speed communication is used, which may result in an increased error rate of transmitted data.

Various error correction codes may be used to correct errors in the data. Using an error correction code having high error correction capability, such as a G-LDPC code may require complicated operations during decoding.

SUMMARY

Some example embodiments may provide a G-LDPC decoder and a G-LDPC decoding method for reducing computational complexity in G-LDPC decoding.

According to some example embodiments, a generalized low-density parity-check (G-LDPC) decoder configured to use a plurality of variable nodes and a plurality of generalized check nodes, is provided. The G-LDPC decoder includes: generalized check node decoder circuitry configured to, in each of a plurality of iterations: group connected variable nodes, among the plurality of variable nodes, into a plurality of groups based on a predetermined condition, the connected variable nodes being connected to an $m^{th}$ generalized check node among the plurality of generalized check nodes; generate test patterns in each of one or more of the plurality of groups based on a first message received by the $m^{th}$ generalized check node from the connected variable nodes; and identify a value of a second message to be provided from the $m^{th}$ generalized check node to the connected variable nodes based on the test patterns; and low-density parity-check (LDPC) decoder circuitry configured to, in each of the plurality of iterations, update a value of an $n^{th}$ variable node, among the plurality of variable nodes, based on the second message received by the $n^{th}$ variable node from a generalized check node that is connected to the $n^{th}$ variable node.

According to some example embodiments, a G-LDPC decoder using a plurality of variable nodes and a plurality of generalized check nodes, is provided. The G-LDPC decoder includes: generalized check node decoder circuitry configured to, in each of a plurality of iterations, perform modified Chase decoding on a first message that an $m^{th}$ generalized check node, among the plurality of generalized check nodes, receives from connected variable nodes among the plurality of variable nodes to identify a value of a second message to be provided from the $m^{th}$ generalized check node to the connected variable nodes, the connected variable nodes being connected to the $m^{th}$ generalized check node; and LDPC decoder circuitry configured to, in each of the plurality of iterations, update a value of an $n^{th}$ variable node, among the plurality of variable nodes, based on the second message that the $n^{th}$ variable node receives from a generalized check node connected to the $n^{th}$ variable node among the plurality of generalized check nodes. The modified Chase decoding is decoding into which Chase decoding is modified so as to generate fewer than $2^p$ test patterns based on a value of the first message, and p is a value identified based on a minimum value of a Hamming distance of a subcode used for the $m^{th}$ generalized check node.

According to some example embodiments, a decoding method of a G-LDPC decoder performed using a plurality of variable nodes and a plurality of generalized check nodes, is provided. The decoding method includes: propagating a first message to an $m^{th}$ generalized check node, among the plurality of generalized check nodes, from connected variable nodes connected to the $m^{th}$ generalized check node among the plurality of variable nodes; grouping the connected variable nodes into a plurality of groups based on a predetermined condition; generating test patterns in each of one or more of the plurality of groups based on the first message; identifying a value of a second message to be provided from the $m^{th}$ generalized check node to the connected variable nodes based on the test patterns; and propagating the second message from the $m^{th}$ generalized check node to the connected variable nodes.

BRIEF DESCRIPTION OF DRAWINGS

The above and other aspects and features will be more apparent from the following description of example embodiments with reference to the attached drawings, in which:

FIG. 4 is a diagram showing an example of a parity check matrix of a LDPC code shown in FIG. 3.

FIG. 5 is a diagram of a parity check matrix of a G-LDPC code.

DETAILED DESCRIPTION

Figure 1:
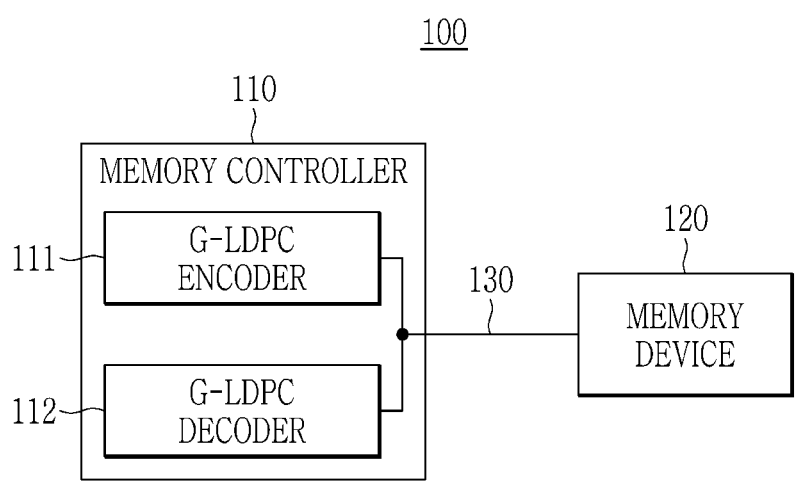
FIG. 1 is a block diagram showing an example of a memory system according to some example embodiments.

Example embodiments will now be described with reference to the accompanying drawings. Embodiments described herein are example embodiments, and thus, the present disclosure is not limited thereto, and may be realized in various other forms. Each example embodiment provided in the following description is not excluded from being associated with one or more features of another example or another example embodiment also provided herein or not provided herein but consistent with the present disclosure.

Accordingly, the drawings and description are to be regarded as illustrative in nature and not restrictive. Like reference numerals indicate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation. The term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a block diagram showing an example of a memory system according to some example embodiments.

Referring to FIG. 1, a memory system 100 may include a memory controller 110 and a memory device 120. The memory controller 110 and the memory device 120 may be connected through a memory interface and exchange signals through the memory interface. The memory interface may include a channel 130 for exchanging the signals.

The memory controller 110 may control a memory operation of the memory device 120 by providing a signal to the memory device 120 through the channel 130. The signal may indicate a command and an address. The memory controller 110 may read data from the memory device 120 by providing a read signal to the memory device 120. Further, the memory controller 110 may write data to the memory device 120 by providing a write signal and data to the memory device 120.

The memory controller 110 may include an error correction code (ECC) encoder 111 and an ECC decoder 112. The ECC encoder 111 and the ECC decoder 112 may use a generalized low-density parity-check (G-LDPC) code as an ECC. Hereinafter, the ECC encoder 111 and the ECC decoder 112 are described as a G-LDPC encoder 111 and a G-LDPC decoder 112, respectively. The G-LDPC may can increase a correction capability by replacing a single parity-check constraint node with a generalized constraint (GC) node on a Tanner graph of an LDPC code.

The G-LDPC encoder 111 may receive data (i.e., information bits) to be written in the memory device 120 and perform G-LDPC encoding on the information bits to generate encoded data. The encoded data may be referred to as a codeword. Accordingly, G-LDPC-encoded data may be written into the memory device 120 based on the write signal. The memory controller 110 may read data from the memory device 120 based on the read signal, and the G-LDPC decoder 112 may perform G-LDPC decoding on the read data to generate decoded bits, thereby restoring original information bits.

In this way, after the memory controller 110 reads data from the memory device 120, and even if an error occurs in the read data, the original information bits can be restored by correcting the error through the G-LDPC decoding. Therefore, even if the error occurs in data in the memory device 120 or the channel 130, the error can be corrected.

In some example embodiments, the memory device 120 may include non-volatile memory. The non-volatile memory may include a flash memory, such as an NAND flash memory. As another example, the non-volatile memory may include a phase-change memory, a resistive memory, a magnetoresistive memory, a ferroelectric memory, or a polymer memory. When the memory device 120 includes the non-volatile memory, the memory system 100 may be used as a storage device. When the memory system 100 is used as the storage device, the memory controller 110 may control the memory device 120 in response to a command from a host device.

In some example embodiments, the memory device 120 may include a volatile memory. The volatile memory may include, for example, a dynamic random-access memory (DRAM). When the memory device 120 includes the volatile memory, the memory device 120 may be used as a system memory of the host device. In this case, the memory controller 110 may be provided as a separate chip from a processor of the host device or may be provided as an internal component of the processor. In some example embodiments, the G-LDPC encoder 111 and the G-LDPC decoder 112 may be formed in the memory device 120 instead of the memory controller 110.

Figure 2:
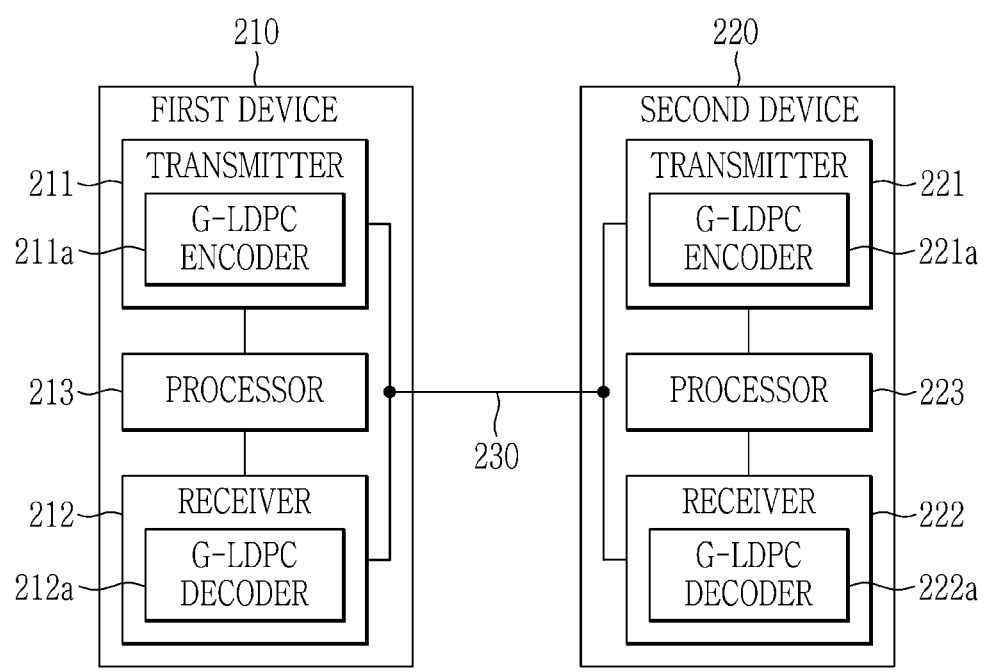
FIG. 2 is a block diagram showing an example of a communication system according to some example embodiments.

FIG. 2 is a block diagram showing an example of a communication system according to some example embodiments.

Referring to FIG. 2, a communication system 200 may include a first device 210 and a second device 220.

The first device 210 may include a transmitter 211, a receiver 212, and a processor 213, and the second device 220 may include a transmitter 221, a receiver 222 and a processor 223. The transmitters 211 and 221 may include G-LDPC encoders 211a and 221a, respectively, and the receivers 212 and 222 may include G-LDPC decoders 212a and 222a, respectively.

When the first device 210 transmits data to the second device 220, the transmitter 211 may perform G-LDPC encoding on the data (i.e., information bits) using the G-LDPC encoder 211a and transmit the encoded data to the second device 220 through the channel 230. The receiver 222 may restore original information bits by performing G-LDPC decoding on the received data using the G-LDPC decoder 222a. Similarly, when the second device 220 transmits data to the first device 210, the transmitter 221 may perform G-LDPC encoding on the data (i.e., information bits) using the G-LDPC encoder 221a and transmit the encoded data to the first device 210 through the channel 230. The receiver 212 may restore original information bits by performing G-LDPC decoding on the received data using the G-LDPC decoder 212a. The processor 213 may control operations of the transmitter 211 and the receiver 212, and the processor 223 may control operations of the transmitter 221 and the receiver 222.

As such, even if an error occurs in the data transmitted from the first device 210 to the second device 220, the second device 220 can restore the original information bits by correcting the error through G-LDPC decoding. Accordingly, the error in the data transmitted through the channel 230 can be corrected.

Although FIG. 1 and FIG. 2 show the G-LDPC decoders used in the memory system and the communication system, systems or devices to which the G-LDPC decoder is applied are not limited thereto. The G-LDPC decoder may be used to prevent an error in data in various devices.

Next, a G-LDPC code is described with reference to FIG. 3 to FIG. 6.

Figure 3:
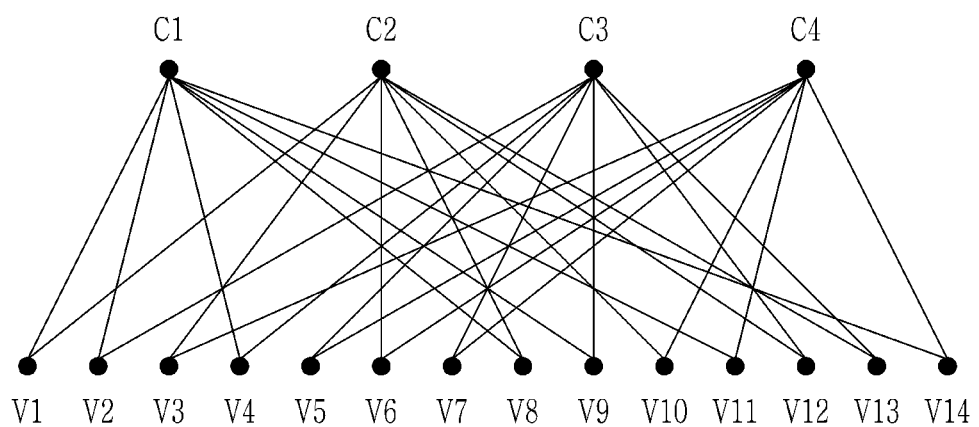
FIG. 3 is a diagram showing an example of a Tanner graph of an LDPC code.
Figure 5:
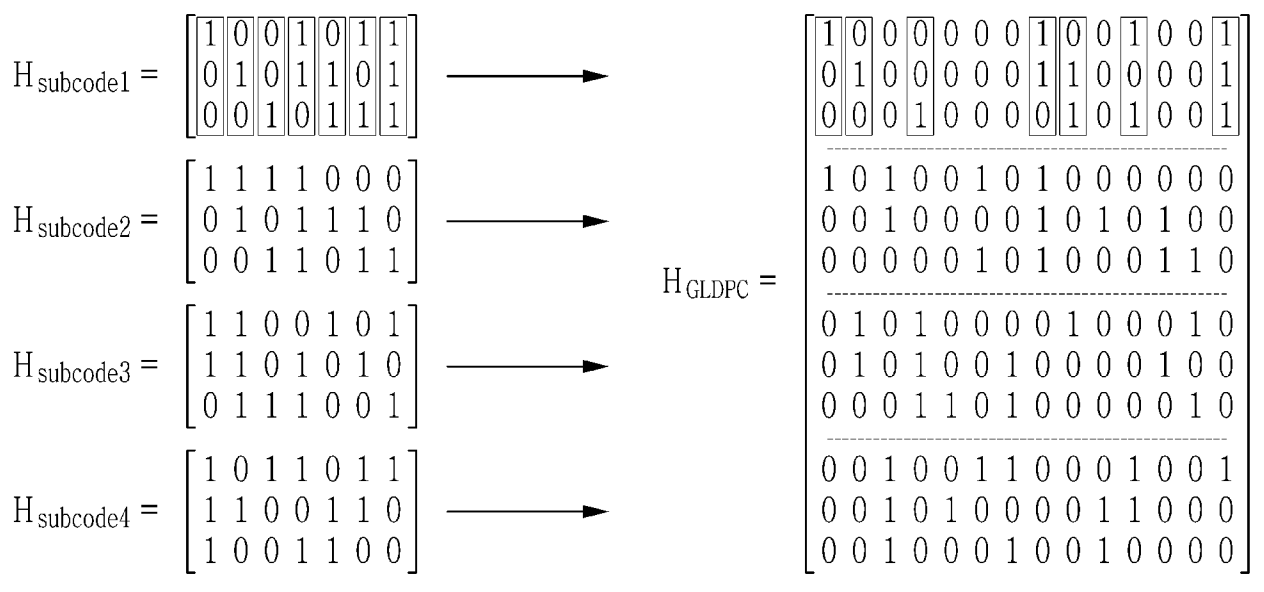
Figure 6:
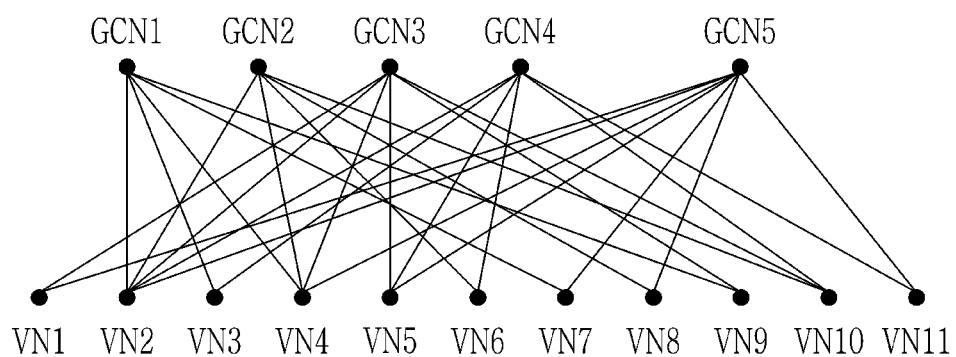
FIG. 6 is a diagram showing an example of a Tanner graph of an irregular G-LDPC code.

FIG. 3 is a diagram showing an example of a Tanner graph of an LDPC code, FIG. 4 is a diagram showing an example of a parity check matrix of a LDPC code shown in FIG. 3, FIG. 5 is a diagram of a parity check matrix of a G-LDPC code, and FIG. 6 is a diagram showing an example of a Tanner graph of an irregular G-LDPC code.

Referring to FIG. 3 and FIG. 4, a Tanner graph of an LDPC code may correspond to a parity check matrix of the LDPC code. The Tanner graph may consist of variable nodes, check nodes, and edges connecting the variable nodes and the check nodes. For convenience, FIG. 3 and FIG. 4 show examples of the Tanner graph and the parity check matrix that include 14 variable nodes V1, V2 ... V14, and 4 check nodes C1, C2, C3, and C4, and in which a column weight is 2 and a row weight is 7. Therefore, one check node may be connected to 7 variable nodes by the edges, and one variable node may be connected to two check nodes by the edges. The number of check nodes in the Tanner graph may be equal to the number of rows in the parity check matrix, and the number of variable nodes in the Tanner graph may be equal to the number of columns in the parity check matrix. Each element of the parity check matrix H may be denoted as h(i,j). Here, i may be an index indicating a row of the parity check matrix H, and j may be an index indicating a column of the parity check matrix H. When a value of the element h(i,j) in the parity check matrix H is '1', the $i^{th}$ check node Ci and the $j^{th}$ variable node Vj may be connected to each other in the Tanner graph. When the value of the element h(i,j) of the parity check matrix H is '0', the $i^{th}$ check node Ci and the $j^{th}$ variable node Vj may not be connected.

The G-LDPC code may be expressed as a Tanner graph in which the check nodes C1 to C4 of the LDPC code are replaced with generalized check nodes (generalized CNs or GCNs). The generalized check node may be a check node related to a generalized code (e.g., generalized block code) other than a single parity check code. The generalized check node may be referred to as a generalized constraint node or a super check node. In addition, the generalized block code may be referred to as a subcode.

When a check node is replaced by a generalized check node in the G-LDPC code, '1' in a row of a parity check matrix H may be replaced with a column of a block code parity matrix (subcode) in the generalized check node and '0' may be replaced with a zero column vector to generate a parity check matrix $H_{GLDPC}$ for the G-LDPC code. As shown in FIG. 5, four block code parity matrices $H_{subcode1}$, $H_{subcode2}$, $H_{subcode3}$, and $H_{subcode4}$ respectively corresponding to the four generalized check nodes may be given. For convenience, FIG. 5 shows an example in which the generalized block code used for each generalized check node is a Bose-Chaudhuri-Hocquenghem (BCH) code, particularly, a BCH(7,4,3).

Therefore, as shown in FIG. 5, '1' in the first row of the parity check matrix H may be replaced with one column among 7 columns of the block code parity matrix $H_{subcode1}$ corresponding to the first generalized check node (C1 in FIG. 3), '1' in the second row may be replaced with one column among 7 columns of the block code parity matrix $H_{subcode2}$ corresponding to the second generalized check node (C2 in FIG. 3), '1' in the third row may be replaced with one column among 7 columns of the block code parity matrix $H_{subcode3}$ corresponding to the third generalized check node (C3 in FIG. 3), and '1' in the fourth row may be replaced with one column among 7 columns of the block code parity matrix $H_{subcode4}$ corresponding to the fourth generalized check node (C4 in FIG. 3). As a result, the parity check matrix $H_{GLDPC}$ of the G-LDPC code may be generated.

A G-LDPC encoder may generate a codeword by encoding information bits using the G-LDPC code, i.e., the parity check matrix $H_{GLDPC}$. The codeword may include the information bits and parity bits. The G-LDPC encoder may generate the codeword such that a product of the parity check matrix $H_{GLDPC}$ and a transposition matrix of the codeword is a zero vector.

Although the G-LDPC code has been described based on a regular LDPC code having the same degree of all variable nodes in FIG. 3 to FIG. 5, a G-LDPC code may also be generated based on an irregular LDPC code. For example, as shown in FIG. 6, at least some of check nodes in a Tanner graph of the irregular LDPC code may be replaced with generalized check nodes. For convenience, FIG. 6 shows a Tanner graph including 11 variable nodes VN1, VN2 ... VN11 and 5 generalized check nodes GCN1, GCN2, GCN3, GCN4, and GCN5. As shown in FIG. 6, the variable node VN1 may be connected to the generalized check nodes GCN3 and GCN5, the variable node VN2 may be connected to the generalized check nodes GCN1 to GCN5, the variable node VN3 may be connected to the generalized check nodes GCN1 and GCN4, the variable node VN4 may be connected to the generalized check nodes GCN1 to GCN3 and GCN5, the variable node VN5 may be connected to the generalized check nodes GCN3 to GCN5, the variable node VN6 may be connected to the generalized check nodes GCN2 and GCN4, the variable node VN7 may be connected to the generalized check nodes GCN1 and GCN5, the variable node VN8 may be connected to the generalized check nodes GCN2 and GCN5, the variable node VN9 may be connected to the generalized check nodes GCN1 and GCN3, the variable node VN10 may be connected to the generalized check nodes GCN2 to GCN4, and the variable Node VN11 may be connected to the generalized check nodes GCN4 and GCN5. As described above, the parity check matrix of the G-LDPC code shown in FIG. 6 may also be determined by applying a block code parity matrix of the generalized check node to the parity check matrix of the LDPC code shown in FIG. 6.

Next, a G-LDPC decoder and a G-LDPC decoding method according to some example embodiments are described with reference to FIG. 7 to FIG. 14.

Figure 7:
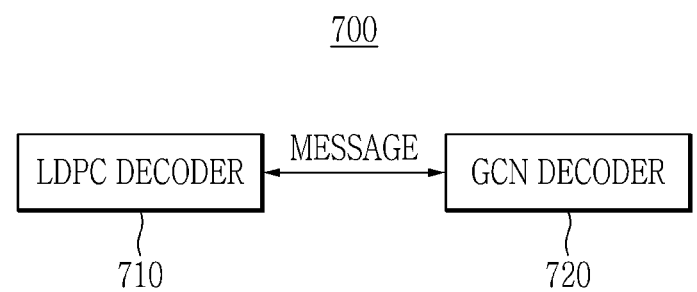
FIG. 7 is a block diagram showing an example of a G-LDPC decoder according to some example embodiments.

FIG. 7 is a block diagram showing an example of a G-LDPC decoder according to some example embodiments.

Referring to FIG. 7, a G-LDPC decoder 700 may include an LDPC decoder 710 and a generalized check node decoder (GCN decoder) 720.

In an $r^{th}$ iteration, the LDPC decoder 710 may propagate a message from each variable node to a generalized check node to which the corresponding variable node is connected. Here, r is a natural number. In some example embodiments, the LDPC decoder 710 may determine a value of a message (also referred to as a "message value") to be propagated from a variable node to a generalized check node based on a value of the corresponding variable node updated in an $(r-1)^{th}$ iteration. For example, the LDPC decoder 710 may determine the value of the message to be propagated to the generalized check node based on a difference between the value of the variable node updated in the $(r-1)^{th}$ iteration and a value of a message received from the corresponding generalized check node in the $(r-1)^{th}$ iteration. In some example embodiments, the value of the variable node and the value of the message may be likelihood values indicating reliability. The likelihood value may be, for example, a log-likelihood ratio (LLR).

In some example embodiments, in the first iteration (r=1), a value of a message to be propagated from each variable node to a generalized check node to which the corresponding variable node is connected may be an initial likelihood value of the corresponding variable node.

In the $r^{th}$ iteration, the GCN decoder 720 may apply modified Chase decoding to messages received from variable nodes connected to each generalized check node to determine values of messages to be propagated from a corresponding generalized check node to the connected variable nodes. The modified Chase decoding may be Chase decoding in which generation and use of the candidate codewords is less than the number of candidate codewords (i.e., test patterns) used in Chase decoding (i.e., typical Chase decoding). Because the Chase decoding uses $2^p$ test patterns, in some example embodiments, the modified Chase decoding may use less than $2^p$ test patterns. Here, p may be defined as an integer part $[d/2]$ of d/2, and d may be a minimum value of a Hamming distance of a subcode used for a generalized check node.

In the $r^{th}$ iteration, the LDPC decoder 710 may update a value of each variable node based on the value of the message received from the generalized check node connected to the corresponding variable node. In addition, the LDPC decoder 710 may calculate a syndrome based on the updated values of the plurality of variable nodes, and may perform a next iteration ($(r+1)^{th}$ iteration) when the syndrome does not satisfy a constraint condition.

Figure 8:
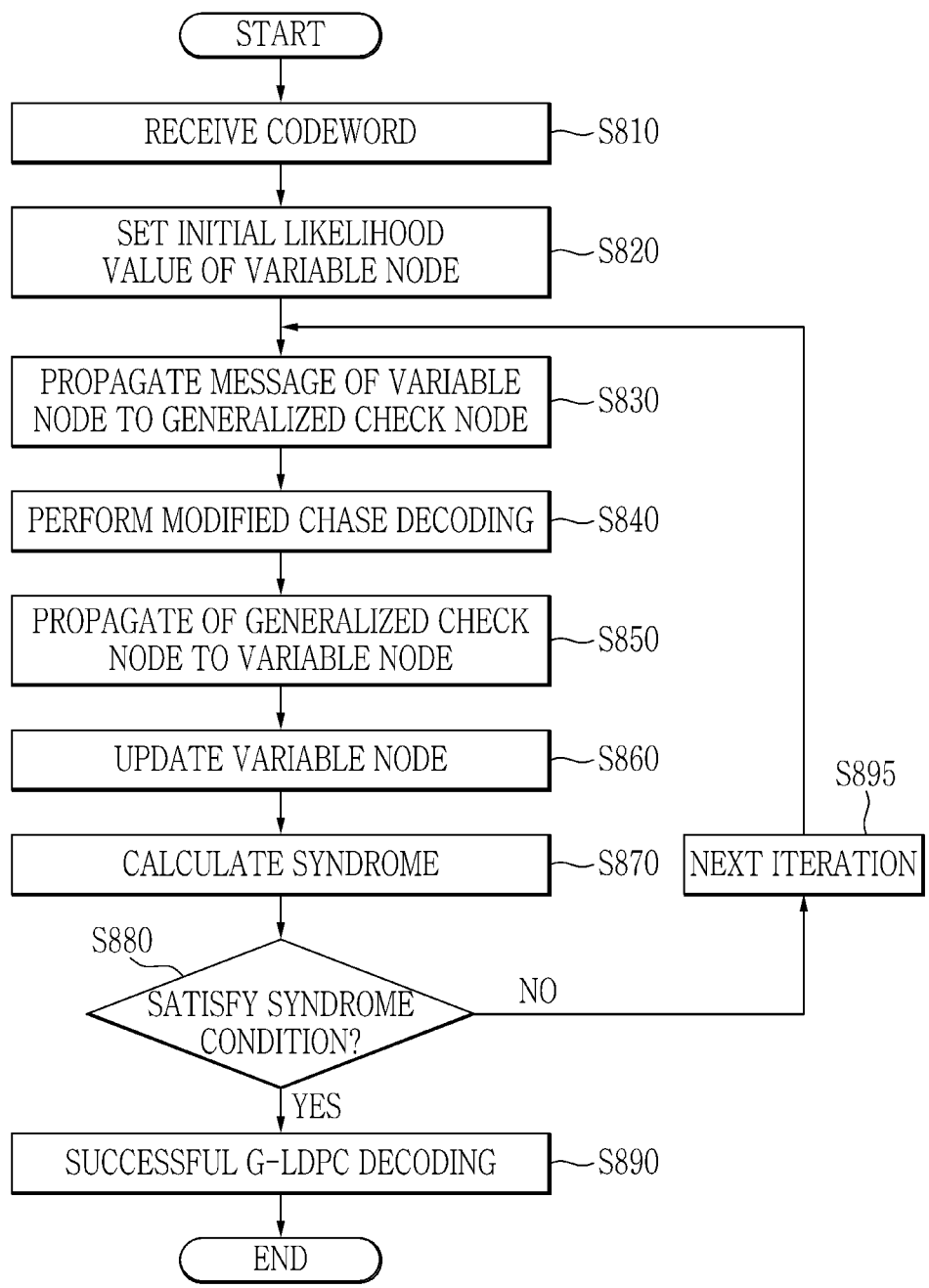
FIG. 8 is a flowchart showing an example of a G-LDPC decoding method according to some example embodiments.

FIG. 8 is a flowchart showing an example of a G-LDPC decoding method according to some example embodiments.

Referring to FIG. 8, a G-LDPC decoder may receive a codeword at S810, and set an initial likelihood value of each variable node (i.e., each bit of the codeword) based on the codeword at S820. Next, the G-LDPC decoder may perform a G-LDPC decoding operation in the $r^{th}$ iteration at S830-S880.

First, the G-LDPC decoder may propagate a message of the $n^{th}$ variable node to a generalized check node connected to the $n^{th}$ variable node among a plurality of generalized check nodes at S830. The G-LDPC decoder may perform operation of S830 for each variable node. A value of the message of each variable node may be determined based on a value (e.g., likelihood value) of the corresponding variable node updated in the $(r-1)^{th}$ iteration. In the first iteration (r=1), the value of the message of each variable node may include the initial likelihood value of the corresponding variable node.

The G-LDPC decoder may perform modified Chase decoding at the $m^{th}$ generalized check node based on messages received from variable nodes connected to the $m^{th}$ generalized check node among a plurality of variable nodes at S840. The G-LDPC decoder may perform an operation of S840 for all generalized check nodes. In a case of using Chase decoding (i.e., typical Chase decoding), the G-LDPC decoder may select p variable nodes from among the variable nodes connected to the $m^{th}$ generalized check node based on reliability information of the variable nodes. When using the modified Chase decoding according to some example embodiments, the G-LDPC decoder may group the variable nodes connected to the $m^{th}$ generalized check nodes into a plurality of groups G1 to GK based on a predetermined condition, and select pk variable node(s) from the $k^{th}$ group Gk based on reliability information of variable node(s) included in the $k^{th}$ group Gk. Here, pk denotes an integer greater than or equal to 0, k denotes an integer from 1 to K, and K denotes the number of groups. In some example embodiments, a case where pk=0 may indicate that the G-LDPC decoder does not select pk variable node(s) from a group assigned pk=0. In this case, a sum of p1 to pK, $\Sigma_{k=1}^{K}$ pk may be equal to p in the Chase decoding. In some example embodiments, the predetermined condition may include degrees of the variable nodes. The degree of the variable node may indicate the number of generalized check nodes connected to the corresponding variable node. In some example embodiments, because a probability of error occurrence may decrease as the degree of the variable node increases, the generalized check node may set the pk assigned to each group Gk in inverse proportion to the degree of the variable node(s) belonging to the group Gk. The G-LDPC decoder may select pk variable node(s) having the least reliable position among the variable node(s) belonging to each group Gk. Therefore, in the modified Chase decoding, the generalized check node may generate $2^{pk}$ test patterns in each group and perform the Chase decoding based on the test patterns generated in the plurality of groups.

Next, the G-LDPC decoder may propagate a message including extrinsic information generated through the modified Chase decoding at the $m^{th}$ generalized check node to the corresponding variable node at S850. The LDPC decoder may perform an operation of S850 for all generalized check nodes. In some example embodiments, the extrinsic information propagated to each variable node may include a value (e.g., a likelihood value) of the corresponding variable node updated through the modified Chase decoding.

The G-LDPC decoder may update the value of the $n^{th}$ variable node based on the message received from the generalized check node connected to the $n^{th}$ variable node at S860. The G-LDPC decoder may perform operation S860 for each variable node. In some example embodiments, the G-LDPC decoder may update the value of the $n^{th}$ variable node by adding the values (e.g., updated likelihood values) of the messages received from the generalized check nodes connected to the $n^{th}$ variable node and an original value (e.g., likelihood value) of the $n^{th}$ variable node.

The G-LDPC decoder may calculate a syndrome based on the updated values of all variable nodes at S870. In some example embodiments, the G-LDPC decoder may decide a bit value of each variable node based on the updated value of the corresponding variable node, generate a codeword including the decided values of the plurality of variable nodes, and calculate the syndrome by multiplying the parity check matrix by a transposition matrix of the codeword. The G-LDPC decoder may determine whether the calculated syndrome satisfies a syndrome condition (i.e., constraint condition) at S880. In some example embodiments, the syndrome condition (or the constraint condition) may be that the calculated syndrome is a zero vector. In this regard, the G-LDPC decoder may determine that the syndrome condition is satisfied when the calculated syndrome is a zero vector.

If the syndrome condition is satisfied, the G-LDPC decoder may determine that the G-LDPC decoding is successful, and restore original data (information bits) from the codeword at S890. For example, the G-LDPC decoder may output predetermined bits of the codeword as information bits.

When the syndrome condition is not satisfied at S880, the G-LDPC decoder may perform a next iteration ($(r+1)^{th}$ iteration) at S890.

Next, the modified Chase decoding performed in S840 of FIG. 8 is described with reference to FIG. 9 and FIG. 10.

Figure 9:
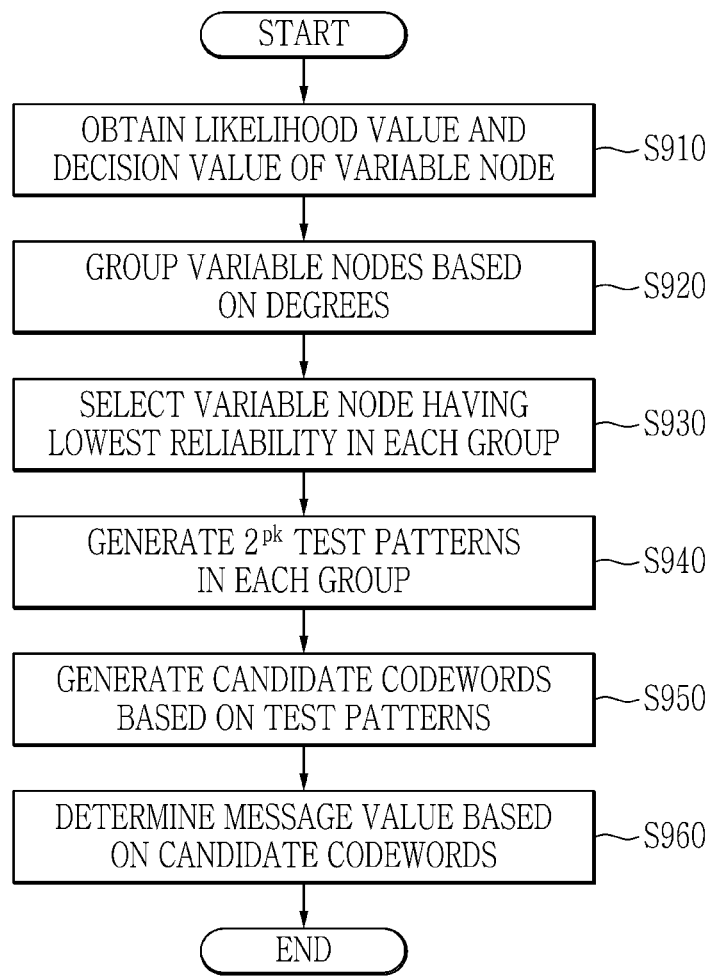
FIG. 9 is a flowchart illustrating an example of modified Chase decoding according to some example embodiments.
Figure 10:
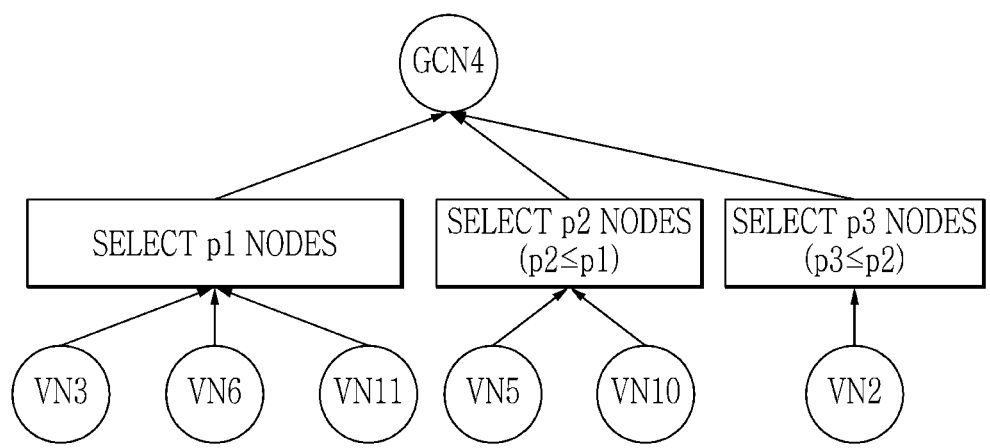
FIG. 10 is a diagram showing an example of a generalized check node and variable nodes for explaining modified Chase decoding according to some example embodiments.

FIG. 9 is a flowchart illustrating an example of modified Chase decoding according to some example embodiments, and FIG. 10 is a diagram showing an example of a generalized check node and variable nodes for explaining modified Chase decoding shown in FIG. 9. For convenience, in FIG. 9 and FIG. 10, an operation in the fourth generalized check node GCN4 among a plurality of generalized check nodes GCN1 to GCN5 shown in FIG. 6 is described, and similar operations may be performed in the other generalized check nodes GCN1-GCN3 and GCN5.

Referring to FIG. 9 and FIG. 10, each variable node may propagate a message to connected generalized check nodes. Accordingly, each generalized check node (e.g., the fourth generalized check node) GCN4 may receive messages from connected variable nodes VN2, VN3, VN5, VN6, VN10, and VN11. In the G-LDPC decoder, the generalized check node GCN4 may obtain, based on the message received from each variable node, reliability information of the corresponding variable node and a decision value of the corresponding variable node at S910. Each variable node (i.e., the decision value of each variable node) may correspond to a bit of a codeword. In some example embodiments, the message received from the variable node may include the reliability information, which may be, for example, a likelihood value. Hereinafter, the reliability information is described as the likelihood value. In some example embodiments, the decision value of each variable node may be a value decided based on the likelihood value of the corresponding variable node, and may be, for example, a value decided based on a sign of the likelihood value. For example, the decision value of each variable node may be a hard decision value of the likelihood value of the corresponding variable node. Accordingly, the generalized check node GCN4 may have a set Y of decision values of variable nodes as in Equation 1.

$$Y = \{y_1, y_2, \ldots, y_l\} \qquad \text{Equation 1}$$

In Equation 1, l denotes the number of variable nodes connected to the generalized check node GCN4, and indices correspond to the connected variable nodes VN2, VN3, VN5, VN6, VN10, and VN11 in order.

As described above, the G-LDPC decoder may group the variable nodes VN2, VN3, VN5, VN6, VN10, and VN11 connected to the generalized check node GCN4 into a plurality of groups G1 to GK based on a predetermined condition at S920. Here, K denotes a natural number indicating the number of groups and may be a value predetermined in the G-LDPC decoder. In some example embodiments, because a probability of error occurrence may decrease as a degree of the variable node increases, the predetermined condition may indicate the degrees of the variable nodes. In some example embodiments, the G-LDPC decoder may allocate variable nodes having the same degree to the same group and variable nodes having different degrees to different groups, thereby grouping the variable nodes into the plurality of groups based on the degrees of the variable nodes. In some example embodiments, the G-LDPC decoder may allocate variable nodes having degrees included in a predetermined range to the same group and variable nodes having degrees included in different ranges to different groups, thereby grouping the variable nodes into the plurality of groups based on the degrees of the variable nodes. In addition, because the probability of error occurrence may decrease as the degree of the variable node increases, the G-LDPC decoder may set pk (i.e., the number of variable node(s) selected from each group Gk) assigned to each group Gk to be inversely proportional to the degree of the variable node(s) belonging to the corresponding group Gk. That is, a small pk may be used in a group Gk including a variable node with a high degree, and a large pk may be used in a group Gk including a variable node with a low degree.

As shown in FIG. 6 and FIG. 10, the degree of the variable node VN2 is 5, the degree of the variable node VN3 is 2, the degree of the variable node VN5 is 3, the degree of the variable node VN6 is 2, the degree of the variable node VN10 is 3, and the degree of the variable node VN11 is 2. Thus, for example, the first group G1 may include the variable nodes VN3, VN6, and VN11, the second group G2 may include the variable nodes VN5 and VN10, and the third group G3 may include the variable node VN2. In this case, the G-LDPC decoder may select p1 variable node(s) from the first group G1, select p2 (p2<p1) variable node(s) from the second group G2, and select p3 (p3 p2) variable node(s) from the third group G3. For example, the G-LDPC decoder may select two variable nodes from the first group G1 (p1=2), select one variable node from the second group G2 (p2=1), and select no variable node from the third group G3 or one variable node from the third group G3 (p3=1). In some example embodiments, a case where no variable node is selected from the third group G3 may indicate that the G-LDPC decoder selects pk variable node(s) from each of the first and second groups G1 and G2. As another example, the first group G1 may include variable nodes VN3, VN6, and VN11, and the second group G2 may include variable nodes VN2, VN5, and VN10. In this case, for example, the G-LDPC decoder may select two variable nodes from the first group G1 (p1=2) and select one variable node from the second group G2 (p2=1).

The G-LDPC decoder may select pk variable node(s) having the least reliable position from among the variable node(s) belonging to each group Gk at S930. That is, the G-LDPC decoder may select pk variable node(s) having the lowest reliability (e.g., likelihood value) from among the variable node(s) belonging to each group Gk. The variable node with the lowest reliability may be referred to as a suspicious variable node or a suspicious bit.

The G-LDPC decoder may generate a plurality of test patterns $T^{qk}$ from the pk variable node(s) of each group Gk at S940. In some example embodiments, the G-LDPC decoder may generate $2^{pk}$ (=qk) error patterns $E^{qk}$ having all possible errors in the pk variable node(s) at S940. For example, the G-LDPC decoder may generate the $2^{pk}$ error patterns $E^{qk}$ by allocating '0' or '1' to the pk variable node(s) in each group Gk at S940. All other variable nodes in each error pattern may be assigned '0'. The G-LDPC decoder may generate each test pattern $T^{qk}$ based on each error pattern $E^{qk}$ and the set Y of the decision values of the variable nodes at S940. In some example embodiments, the G-LDPC decoder may generate the test pattern $T^{qk}$ by adding elements of the error pattern $E^{qk}$ and elements of the set Y as in Equation 2. In this case, the sum may correspond to a modulo 2 operation of the sum, i.e., an exclusive OR (XOR) operation. The generalized check node GCN4 may generate, for example, $\Sigma_{k=1}^{K} 2^{pk}$ (=q) test patterns $T^q$ from the plurality of groups G1 to GK as in Equation 3. In this way, by grouping the variable nodes into the plurality of groups to generate the test patterns $T^q$, the less test patterns may be used than test patterns of the Chase decoding, thereby reducing complexity of a decoding operation. As a result, waste of computing resources may be prevented.

$$T^{qk} = Y \oplus E^{qk} \quad \text{Equation 2}$$

$$T^q = \{T^{qk}, k \in [1, K]\} \quad \text{Equation 3}$$

The G-LDPC decoder may generate q candidate codewords $C^q$ by decoding the q test patterns $T^q$ at S950. In some example embodiments, the G-LDPC decoder may generate the candidate codewords $C^q$ in the same way as the Chase decoding. For example, the G-LDPC decoder may decode each test pattern $T^q$ using an algebraic decoder (e.g., a Berlekamp-Massey decoder) to generate the candidate codewords $C^q$.

The G-LDPC decoder may determine extrinsic information (i.e., message value) to be provided to each connected variable node based on the candidate codewords $C^q$ at S960. In some example embodiments, the G-LDPC decoder may determine a set of decision values for each variable node from the candidate codewords $C^q$, calculate an updated likelihood value for the corresponding variable node based on the set of decision values, and determine the message value to be provided to the corresponding variable node from the generalized check node GCN4 based on the updated likelihood value for the corresponding variable node at S960. In some example embodiments, the G-LDPC decoder may determine a value obtained by subtracting the updated likelihood value from the likelihood value of the message received from each variable node as the message value at S960.

Figure 11:
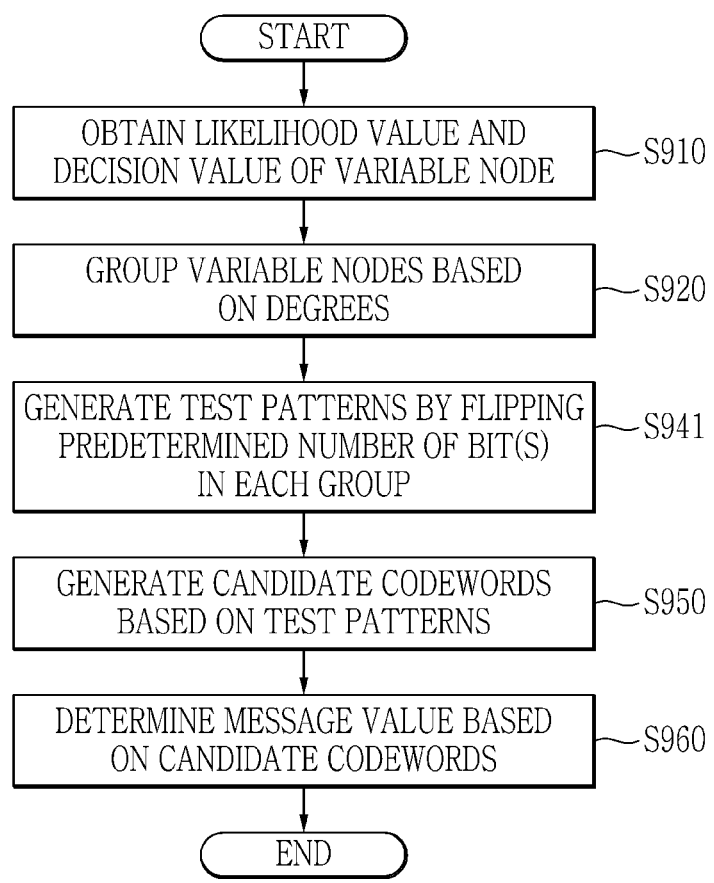
FIG. 11 and FIG. 12 are flowcharts showing examples of modified Chase decoding according to some example embodiments.

FIG. 11 is a flowchart showing an example of modified Chase decoding according to some example embodiments.

Referring to FIG. 11, a G-LDPC decoder may generate a plurality of test patterns in a method different from example embodiments described with reference to FIG. 9.

As described with reference to FIG. 9 and FIG. 10, the G-LDPC decoder may determine reliability information and a decision value of each variable node connected to a generalized check node GCN4 at S910, and group a plurality of connected variable nodes VN2, VN3, VN5, VN6, VN10, and VN11 connected to the generalized check node GCN4 into a plurality of groups G1 to GK at S920.

The G-LDPC decoder may generate test patterns of each group Gk by flipping a predetermined number of bit(s) (i.e., a decision value of a predetermined number of variable node(s)) in the corresponding group Gk without selecting variable node(s) with least reliable position at S941. In some example embodiments, the predetermined number may be 1 or 2. For example, in the first group G1, the G-LDPC decoder may flip a decision value of a variable node VN3 to generate a test pattern, flip a decision value of a variable node VN6 to generate another test pattern, and flip a decision value of a variable node VN11 to generate yet another test pattern. Further, the G-LDPC decoder may generate test patterns in the same manner in the remaining groups. As another example, in the first group G1, the G-LDPC decoder may flip the decision values of the variable nodes VN3 and VN6 to generate a test pattern, flip the decision values of the variable nodes VN6 and VN11 to generate another test pattern, and flip the decision values of the variable nodes VN3 and VN11 to generate yet another test pattern. Further, the G-LDPC decoder may generate test patterns in the same manner in the remaining groups. Even if the test patterns are created in this way, because the decision values of all variable nodes are flipped once or more, possible errors in all variable nodes may be tested. Further, computational complexity may be reduced by decreasing the number of test patterns compared to the Chase decoding.

Next, as described with reference to FIG. 9, the G-LDPC decoder may decode the test patterns to generate a plurality of candidate codewords, respectively at S950, and determine a message value to be provided to a connected variable node based on the candidate codewords at S960.

Figure 12:
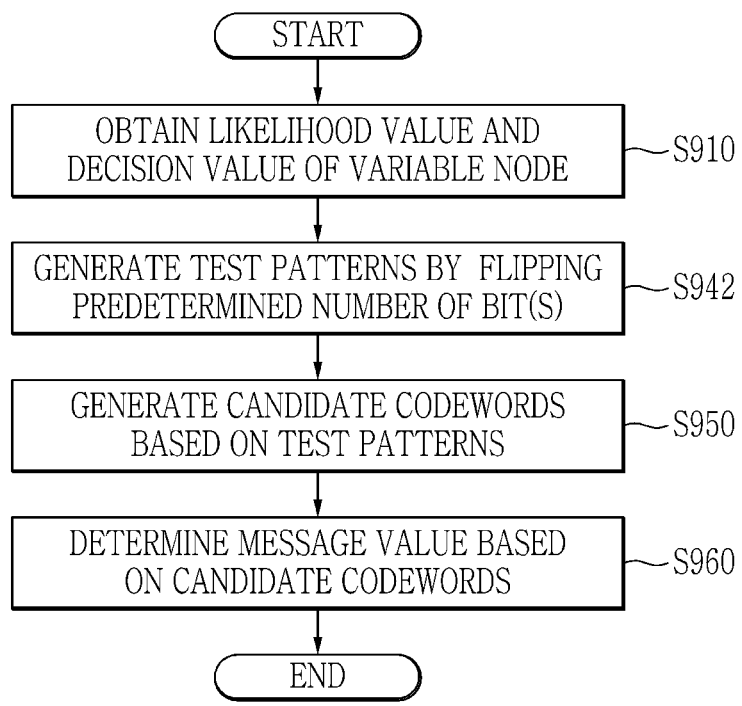

FIG. 12 is a flowchart showing an example of modified Chase decoding according to some example embodiments.

Referring to FIG. 12, a G-LDPC decoder may generate a plurality of test patterns in a method different from example embodiments described with reference to FIG. 9.

As described with reference to FIG. 9 and FIG. 10, the G-LDPC decoder may determine reliability information and decision values of each variable node connected to a generalized check node GCN4 at S910.

The G-LDPC decoder may generate test patterns by flipping a predetermined number of bit(s) (i.e., a decision value of a predetermined number of variable node(s)) in connected variable nodes without grouping the variable nodes at S942. In some example embodiments, the predetermined number may be 1 or 2. For example, the G-LDPC decoder may flip a decision value of a variable node VN2 to generate a first test pattern, flip a decision value of a variable node VN3 to generate a second test pattern, flip a decision value of a variable node VN5 to generate a third test pattern, flip a decision value of a variable node VN6 to generate a fourth test pattern, flip a decision value of a variable node VN10 to generate a fifth test pattern, and flip a decision value of a variable node VN11 to generate a sixth test pattern. As another example, the G-LDPC decoder may flip the decision values of the variable nodes VN2 and VN3 to generate a first test pattern, flip the decision values of the variable nodes VN2 and VN5 to generate a second test pattern, flip the decision values of the variable nodes VN2 and VN6 to generate a third test pattern, flip the decision values of the variable nodes VN2 and VN10 to generate a fourth test pattern, and flip the decision values of the variable nodes VN2 and VN11 to generate a fifth test pattern. In the same manner, the G-LDPC decoder may generate test patterns by flipping the decision values of the variable nodes in each of combination of the other two variable nodes among the variable nodes VN2, VN3, VN5, VN6, VN10, and VN11.

Next, as described with reference to FIG. 9, the G-LDPC decoder may decodes the test patterns to generate a plurality of candidate codewords, respectively at S950, and determine a message value to be provided to a connected variable node based on the candidate codewords at S960.

Figure 13:
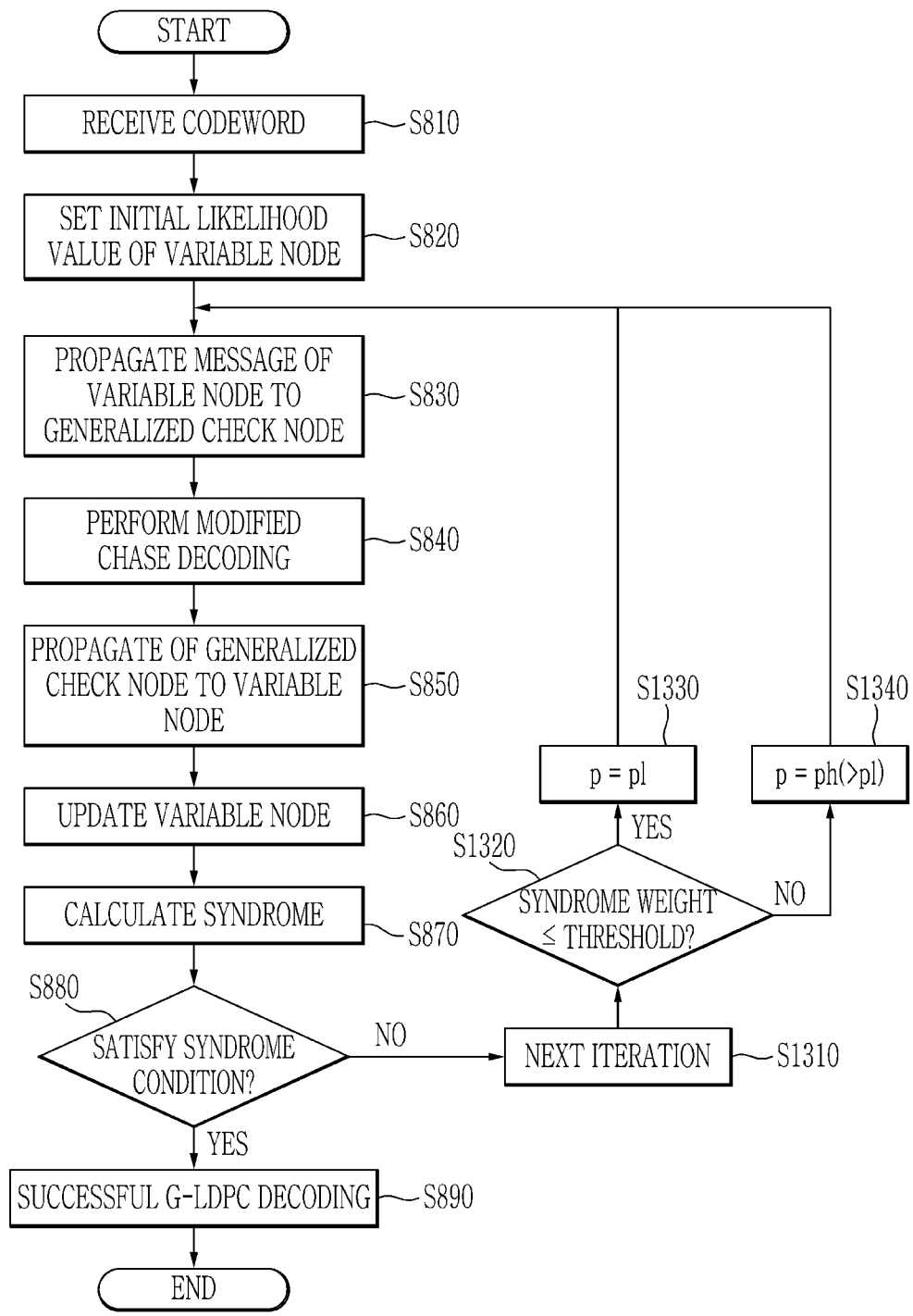
FIG. 13 and FIG. 14 are flowcharts showing examples of G-LDPC decoding according to some example embodiments.
Figure 14:
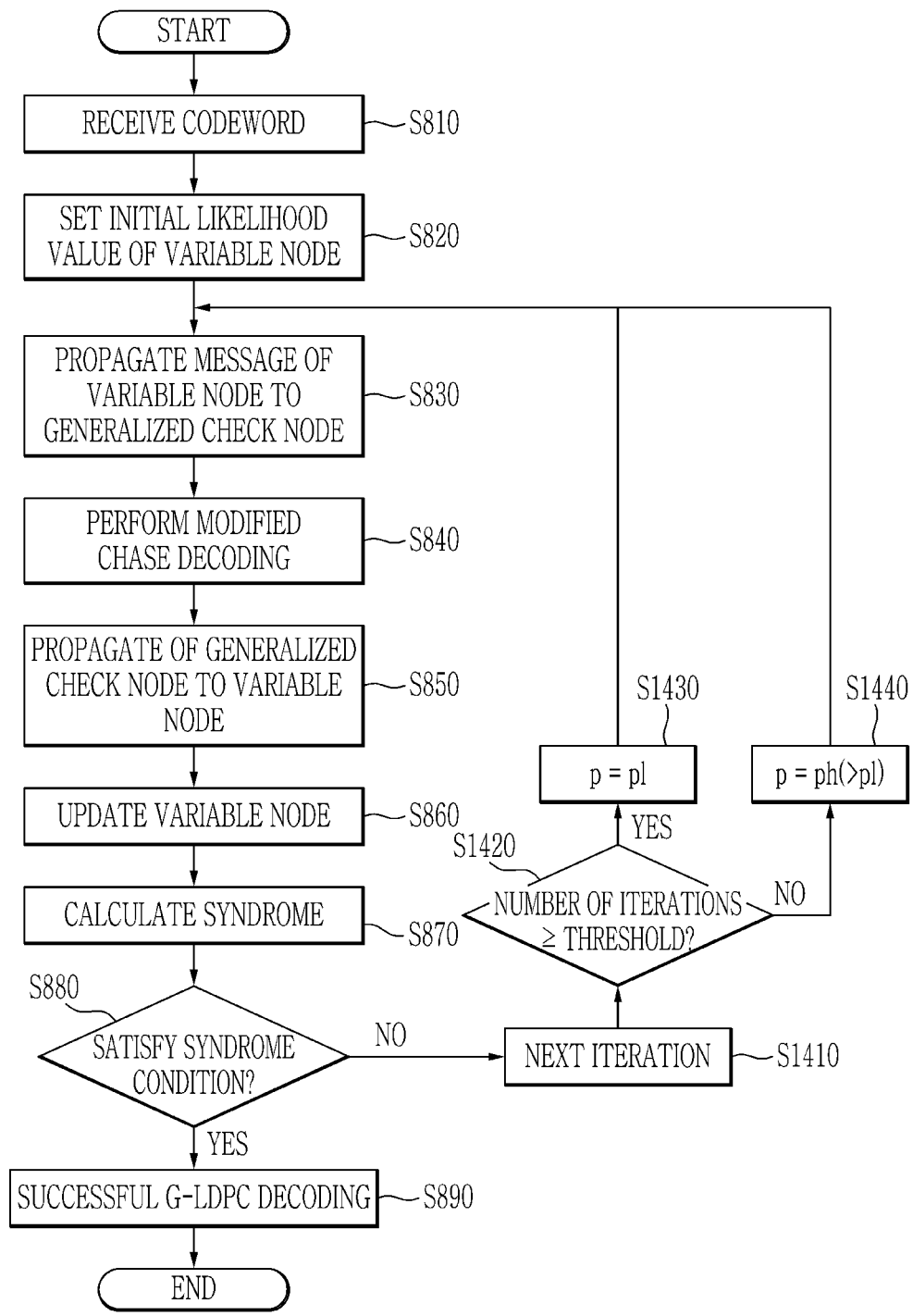

FIG. 13 and FIG. 14 are flowcharts showing examples of G-LDPC decoding according to some example embodiments.

Referring to FIG. 13 and FIG. 14, a G-LDPC decoder may change a value of p, indicating the number of flipped bit(s) (i.e., a predetermined number), based on a state of the LDPC decoder.

Referring to FIG. 13, the state of the LDPC decoder may indicate a weight (also referred to as a "syndrome weight") of a syndrome. When a syndrome condition is not satisfied after G-LDPC decoding is performed at S810 to S880, the G-LDPC decoder may perform a next iteration ((r+1)$^{th}$ iteration) at S1310. In the next iteration, the G-LDPC decoder may compare the syndrome weight with a threshold at S1320. The syndrome weight may correspond to a sum of all elements of the syndrome calculated in S870 of FIG. 8.

When the syndrome weight is less than or equal to the threshold, the G-LDPC decoder may set a small value p1 as the value of p at S1330. When the syndrome weight is greater than the threshold, the G-LDPC decoder may set a value ph greater than the small value p1 as the p value S1340. Here, a case in which the syndrome weight is less than or equal to the threshold may indicate a case in which the syndrome weight is less than a threshold obtained by adding 1 to the threshold. If the syndrome weight is small, it may be expected that the number of remaining error bits in the codeword is small. Accordingly, the G-LDPC decoder may decrease the value of p to reduce the number of test patterns, thereby reducing the computational complexity of the G-LDPC decoding. In some example embodiments, the value of p in the first iteration (r=1) may be set equal to a value of p used in the Chase decoding. That is, the value of p in the first iteration may be an integer part of half of a minimum value of a Hamming distance of a subcode.

In some example embodiments, the G-LDPC decoder may increase the p-value as the syndrome weight increases. That is, the G-LDPC decoder may set the p value in proportion to the syndrome weight.

In some example embodiments, the G-LDPC decoder may set a small value (e.g., 1) as the number of flipped bit(s) (i.e., a predetermined number) in example embodiments described with reference to FIG. 11 or FIG. 12 when the syndrome weight is less than or equal to the threshold, and may set a large value (e.g., 2) as the number of flipped bit(s) when the syndrome weight is greater than the threshold.

Referring to FIG. 14, a state of an LDPC decoder may indicate the number of iterations. When a syndrome condition is not satisfied after G-LDPC decoding is performed at S810-S880, the G-LDPC decoder may perform a next iteration ((r+1)$^{th}$ iteration) at S1410. In the next iteration, the G-LDPC decoder may compare the number of iterations of G-LDPC decoding (i.e., r+1) with a threshold at S1420.

If the number of iterations is greater than or equal to the threshold, the G-LDPC decoder may set a small value p1 as a value of p at S1430. If the number of iterations is less than the threshold, the G-LDPC decoder may set a value ph greater than the small value p1 as the value of p at S1440. Here, a case where the number of iterations is greater than or equal to the threshold may indicate a case where the number of iterations is greater than a threshold obtained by subtracting 1 from the threshold. If the number of iterations is large, it may be expected that the number of remaining error bits in the codeword is small. Accordingly, the G-LDPC decoder may decrease the value of p to reduce the number of test patterns, thereby reducing the computational complexity of the G-LDPC decoding. In some example embodiments, the G-LDPC decoder may decrease the value of p as the number of iterations increases. That is, the G-LDPC decoder may the value of p in inverse proportion to the number of iterations. In some example embodiments, the value of p in the first iteration (r=1) may be set equal to a value of p used in the Chase decoding. That is, the value of p in the first iteration may be an integer part of half of a minimum value of a Hamming distance of a subcode.

In some example embodiments, the G-LDPC decoder may set a small value (e.g., 1) as the number of flipped bit(s) (i.e., a predetermined number) in example embodiments described with reference to FIG. 11 or FIG. 12 when the number of iterations is greater than or equal to the threshold, and may set a large value (e.g., 2) as the number of flipped bit(s) when the number of iterations is less than the threshold.

In some example embodiments, each of the components, elements, modules, or units represented by a block as illustrated in FIGS. 1, 2 and 7 may be implemented as various numbers of hardware, software, and/or firmware structures that execute respective functions described above, according to example embodiments. For example, at least one of these components, elements, modules, or units may include various hardware components including a digital circuit, a programmable or non-programmable logic device or array, an application specific integrated circuit (ASIC), or other circuitry using a digital circuit structure, such as a memory, a processor, a logic circuit, a look-up table, etc., that may execute the respective functions through controls of one or more microprocessors or other control apparatuses. Further, at least one of these components, elements, modules, or units may include a module, a program, or a part of code, which contains one or more executable instructions for performing specified logic functions, and executed by one or more microprocessors or other control apparatuses. Furthermore, at least one of these components, elements, modules, or units may further include or may be implemented by a processor that performs the respective functions. Functional aspects of example embodiments may be implemented in algorithms that execute on one or more processors.

While aspects of example embodiments have been particularly shown and described, it will be understood that various changes in form and details may be made therein without departing from the spirit and scope of the following claims.

What is claimed is:

1. A generalized low-density parity-check (G-LDPC) decoder configured to use a plurality of variable nodes and a plurality of generalized check nodes, the G-LDPC decoder comprising:
   generalized check node decoder circuitry configured to, in each of a plurality of iterations:
      group connected variable nodes, among the plurality of variable nodes, into a plurality of groups based on a predetermined condition, the connected variable nodes being connected to an m$^{th}$ generalized check node among the plurality of generalized check nodes;
      generate test patterns in each of one or more of the plurality of groups based on a first message received by the m$^{th}$ generalized check node from the connected variable nodes; and
      identify a value of a second message to be provided from the m$^{th}$ generalized check node to the connected variable nodes based on the test patterns; and
   low-density parity-check (LDPC) decoder circuitry configured to, in each of the plurality of iterations, update a value of an n$^{th}$ variable node, among the plurality of variable nodes, based on the second message received by the n$^{th}$ variable node from a generalized check node that is connected to the n$^{th}$ variable node.

2. The G-LDPC decoder of claim 1, wherein the predetermined condition comprises degrees of the connected variable nodes.

3. The G-LDPC decoder of claim 1, wherein the generalized check node decoder circuitry is further configured to:
   select pk variable nodes from each of one or more of the plurality of groups, pk being a positive integer; and generate $2^{pk}$ test patterns having all possible errors of the pk variable nodes based on the first message.

4. The G-LDPC decoder of claim 3, wherein the predetermined condition comprises degrees of the connected variable nodes,
wherein the plurality of groups comprises a first group and a second group, and
wherein based on a degree of a variable node comprised in the first group being lower than a degree of a variable node comprised in the second group, the pk of the first group is greater than the pk of the second group.

5. The G-LDPC decoder of claim 3, wherein the generalized check node decoder circuitry is further configured to change a sum of the pk for each of the plurality of groups based on a state of the LDPC decoder circuitry.

6. The G-LDPC decoder of claim 5, wherein the LDPC decoder circuitry is further configured to calculate a syndrome based on updated values of the plurality of variable nodes,
wherein the state of the LDPC decoder circuitry comprises a weight of the syndrome, and
wherein the generalized check node decoder circuitry is further configured to set the sum of the pk for each of the plurality of groups, when the weight of the syndrome is less than or equal to a threshold, to be less than the sum of the pk for each of the plurality of groups when the weight of the syndrome is greater than the threshold.

7. The G-LDPC decoder of claim 5, wherein the state of the LDPC decoder circuitry comprises a number of iterations, and
wherein the generalized check node decoder circuitry is further configured to set the sum of the pk for each of the plurality of groups, when the number of iterations is greater than or equal to a threshold, to be less than the sum of the pk for each of the plurality of groups when the number of iterations is less than the threshold.

8. The G-LDPC decoder of claim 1, wherein the generalized check node decoder circuitry is further configured to perform Chase decoding based on the test patterns.

9. A generalized low-density parity-check (G-LDPC) decoder using a plurality of variable nodes and a plurality of generalized check nodes, the G-LDPC decoder comprising:
generalized check node decoder circuitry configured to, in each of a plurality of iterations, perform modified Chase decoding on a first message that an $m^{th}$ generalized check node, among the plurality of generalized check nodes, receives from connected variable nodes among the plurality of variable nodes to identify a value of a second message to be provided from the $m^{th}$ generalized check node to the connected variable nodes, the connected variable nodes being connected to the $m^{th}$ generalized check node; and
low-density parity-check (LDPC) decoder circuitry configured to, in each of the plurality of iterations, update a value of an $n^{th}$ variable node, among the plurality of variable nodes, based on the second message that the $n^{th}$ variable node receives from a generalized check node connected to the $n^{th}$ variable node among the plurality of generalized check nodes,
wherein the modified Chase decoding is decoding into which Chase decoding is modified so as to generate fewer than $2^p$ test patterns based on a value of the first message, and
wherein p is a value identified based on a minimum value of a Hamming distance of a subcode used for the $m^{th}$ generalized check node.

10. The G-LDPC decoder of claim 9, wherein the generalized check node decoder circuitry is further configured to:
group the connected variable nodes into a plurality of groups based on a predetermined condition;
select pk variable nodes from each of one or more of the plurality of groups, pk being a positive integer; and
generate $2^{pk}$ test patterns having all possible errors of the pk variable nodes based on the value of the first message, and
wherein the fewer than $2^p$ test patterns comprises the $2^{pk}$ test patterns generated in each of the plurality of groups.

11. The G-LDPC decoder of claim 10, wherein the predetermined condition comprises degrees of the connected variable nodes.

12. The G-LDPC decoder of claim 10, wherein the plurality of groups comprises a first group and a second group, and
wherein based on a degree of a variable node comprises in the first group being lower than a degree of a variable node comprises in the second group, the pk of the first group is greater than the pk of the second group.

13. The G-LDPC decoder of claim 10, wherein a sum of the pk for each of the plurality of groups is equal to p.

14. The G-LDPC decoder of claim 10, wherein the generalized check node decoder circuitry is further configured to change a sum of the pk for each of the plurality of groups based on a state of the LDPC decoder circuitry.

15. The G-LDPC decoder of claim 14, wherein the LDPC decoder circuitry is further configured to calculate a syndrome based on updated values of the plurality of variable nodes,
wherein the state of the LDPC decoder circuitry comprises a weight of the syndrome, and
wherein the generalized check node decoder circuitry is further configured to decrease the sum of the pk for each of the plurality of groups based on the weight of the syndrome being less than or equal to a threshold.

16. The G-LDPC decoder of claim 14, wherein the state of the LDPC decoder circuitry comprises a number of iterations, and
wherein the generalized check node decoder circuitry is further configured to decrease the sum of the pk for each of the plurality of groups based on the number of iterations being greater than or equal to a threshold.

17. The G-LDPC decoder of claim 9, wherein the generalized check node decoder circuitry is further configured to flip a decision value of one or more variable nodes among the connected variable nodes to generate the test patterns.

18. The G-LDPC decoder of claim 17, wherein the generalized check node decoder circuitry is further configured to change a number of the one or more variable nodes based on a state of the LDPC decoder circuitry.

19. The G-LDPC decoder of claim 9, wherein the generalized check node decoder circuitry is further configured to:
group the connected variable nodes into a plurality of groups based on a predetermined condition; and
generate a test pattern by flipping a decision value of one or more variable nodes in each of the plurality of groups, and
wherein the fewer than $2^p$ test patterns comprises the test pattern generated in each of the plurality of groups.

20. A decoding method of a generalized low-density parity-check (G-LDPC) decoder performed using a plurality of variable nodes and a plurality of generalized check nodes, the decoding method comprising:

propagating a first message to an $m^{th}$ generalized check node, among the plurality of generalized check nodes, from connected variable nodes connected to the $m^{th}$ generalized check node among the plurality of variable nodes;

grouping the connected variable nodes into a plurality of groups based on a predetermined condition;

generating test patterns in each of one or more of the plurality of groups based on the first message;

identifying a value of a second message to be provided from the $m^{th}$ generalized check node to the connected variable nodes based on the test patterns; and propagating the second message from the $m^{th}$ generalized check node to the connected variable nodes.

* * * * *